United States Patent
Shiota

(10) Patent No.: US 10,211,378 B2
(45) Date of Patent: Feb. 19, 2019

(54) LIGHT EMITTING DEVICE AND METHOD FOR MANUFACTURING SAME

(71) Applicant: NICHIA CORPORATION, Anan-shi, Tokushima (JP)

(72) Inventor: Yuki Shiota, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/417,816

(22) Filed: Jan. 27, 2017

(65) Prior Publication Data

US 2017/0222101 A1   Aug. 3, 2017

(30) Foreign Application Priority Data

Jan. 29, 2016  (JP) .................. 2016-015196
Jan. 17, 2017  (JP) .................. 2017-006210

(51) Int. Cl.
| | |
|---|---|
| H01L 33/00 | (2010.01) |
| H01L 33/50 | (2010.01) |
| H01L 33/54 | (2010.01) |
| H01L 33/62 | (2010.01) |
| H01L 33/58 | (2010.01) |

(52) U.S. Cl.
CPC .......... *H01L 33/507* (2013.01); *H01L 33/54* (2013.01); *H01L 33/58* (2013.01); *H01L 33/62* (2013.01); *H01L 2933/005* (2013.01); *H01L 2933/0041* (2013.01); *H01L 2933/0066* (2013.01)

(58) Field of Classification Search
CPC ....... H01L 2924/00; H01L 2224/48091; H01L 2224/32245; H01L 2224/48247; H01L 2224/73265; H01L 2224/48465; H01L 2224/97; H01L 2924/00012; H01L 2924/00014; H01L 2924/12035; H01L 2924/12041
See application file for complete search history.

(56) References Cited

U.S. PATENT DOCUMENTS

| | | | |
|---|---|---|---|
| 2011/0309404 A1 | 12/2011 | Lee | |
| 2012/0044667 A1* | 2/2012 | Hanawa | H01L 33/46 362/97.1 |
| 2012/0161180 A1 | 6/2012 | Komatsu et al. | |
| 2012/0319150 A1 | 12/2012 | Shimomura et al. | |
| 2013/0328078 A1* | 12/2013 | Wu | H01L 33/50 257/98 |

(Continued)

FOREIGN PATENT DOCUMENTS

| | | |
|---|---|---|
| JP | 2006-049524 A | 2/2006 |
| JP | 2007-116126 A | 5/2007 |
| JP | 2012-142426 A | 7/2012 |

(Continued)

*Primary Examiner* — Robert G Bachner
(74) *Attorney, Agent, or Firm* — Squire Patton Boggs (US) LLP

(57) ABSTRACT

A light emitting device has: a base; a light emitting element disposed on the base; a light-transmissive member having a pair of opposing portions, the light-transmissive member being disposed on the base such that the light emitting element is interposed between and spaced apart from the pair of opposing portions; a sealing member that contains a phosphor and covers the light emitting element, at least a portion of upper surfaces of the pair of opposing portions, and inner lateral surfaces thereof.

22 Claims, 12 Drawing Sheets

(56) References Cited

U.S. PATENT DOCUMENTS

2016/0003450 A1    1/2016  Lee et al.

FOREIGN PATENT DOCUMENTS

| JP | 2013-04807 A | 1/2013 |
| JP | 2013-021042 A | 1/2013 |
| JP | 2013-080833 A | 5/2013 |
| JP | 2013-153035 A | 8/2013 |
| JP | 2013-258388 A | 12/2013 |
| JP | 2014-241444 A | 12/2014 |
| JP | 2016-100447 A | 5/2016 |
| JP | 2016-115897 A | 6/2016 |
| WO | WO 2012/014853 A1 | 2/2012 |

* cited by examiner

LIGHT EMITTING DEVICE AND METHOD FOR MANUFACTURING SAME

CROSS-REFERENCE TO RELATED APPLICATION

This application claims priority to Japanese Patent Application No. 2016-015196, filed on Jan. 29, 2016 and Japanese Patent Application No. 2017-006210, filed on Jan. 17, 2017, the entire disclosures of which are hereby incorporated by reference in their entireties.

BACKGROUND

1. Technical Field

The present disclosure relates to light emitting devices and methods for manufacturing the same.

2. Description of Prior Art

Japanese Unexamined Patent Application Publication No. 2006-49524 discloses a method for manufacturing a light emitting device that includes a light emitting element and a fluorescent material disposed around the light emitting element so as to convert a part of original light emitted from the light emitting element to light having a different wavelength than that of the original light. The method includes the steps of; forming a frame body with an opening of a predetermined size on a pedestal, which has an upper surface including a mounting region at which the light emitting element is to be mounted, so that the mounting region is located in an region of the upper surface enclosed by an inner wall of the opening; mounting the light emitting element on the upper surface of the pedestal at an approximately center portion of the region of the upper surface enclosed by the inner wall of the opening so that the light emitting element and the inner wall of the opening have an interspace therebetween having an approximately same width around the light emitting element; and filling a hardening composition containing the fluorescent material in the interspace between the light emitting element and the inner wall of the opening to cover the light emitting element with the hardening composition.

SUMMARY OF THE INVENTION

A light emitting device according to an embodiment of the present disclosure includes: a base; a light emitting element disposed on the base; a single or plurality of light-transmissive members that have a pair of opposing portions spaced apart from each other and each having an inner lateral surface and an upper surface, the pair of opposing portions being disposed on the base such that the light emitting element is interposed between and spaced apart from the inner lateral surfaces of the pair of opposing portions; a sealing member that contains a phosphor and covers the light emitting element, at least a portion of the upper surfaces of the pair of opposing portions, and the inner lateral surfaces thereof.

A light emitting device according to an embodiment of the present disclosure includes: a light emitting element; a single or plurality of light-transmissive members that have a pair of opposing portions spaced apart from each other and each having an inner lateral surface and an upper surface, the pair of opposing portions being arranged such that the light emitting element is interposed between and spaced apart from the inner lateral surfaces of the pair of opposing portions; a sealing member that contains a phosphor and covers the light emitting element, at least a portion of the upper surfaces of the pair of opposing portions, and the inner lateral surfaces thereof.

A method for manufacturing a light emitting device according to an embodiment of the present disclosure includes the steps of: disposing a light emitting element on a base; disposing a single or plurality of light-transmissive members on the base so that the light emitting element is interposed between and spaced apart from at least one pair of opposing portions of the single or plurality of light-transmissive members; covering the base, the at least one pair of opposing portions of the single or plurality of light-transmissive members, and the light emitting element with a sealing member containing a phosphor; and cutting the base, the at least one pair of opposing portions of the single or plurality of light-transmissive members, and the sealing member, along paths on which the at least one pair of opposing portions are disposed.

A method for manufacturing a light emitting device according to an embodiment of the present disclosure includes the steps of: disposing a light emitting element on a base; disposing a single or plurality of light-transmissive members on the base so that the light emitting element is interposed between and spaced apart from at least one pair of opposing portions of the single or plurality of light-transmissive members; covering the base, the at least one pair of opposing portions of the single or plurality of light-transmissive members, and the light emitting element with a sealing member containing a phosphor; and separating the base from the light emitting element, the single or plurality of light-transmissive members, and the sealing member; and cutting the at least one pair of opposing portions of the single or plurality of light-transmissive members and the sealing member, along paths on which the at least one pair of opposing portions are disposed.

The light emitting devices and the methods for manufacturing the same according to the embodiments of the present disclosure enable adjustment of unevenness in chromaticity distribution of the light emitting devices.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings.

DESCRIPTION OF EMBODIMENTS

Figure 1A:
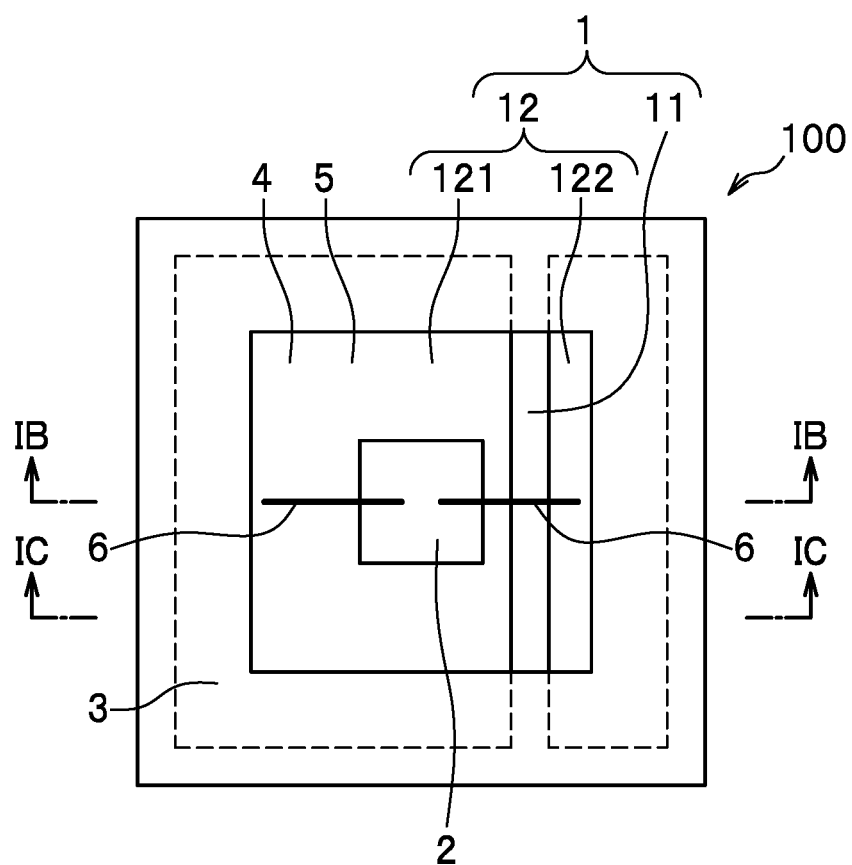
FIG. 1A is a schematic plan view showing the structure of a light emitting device according to a first embodiment of the present disclosure.

Light emitting devices and methods for manufacturing the same according to embodiments will be described with reference to the accompanying drawings, wherein like reference numerals designate corresponding or identical elements throughout the various drawings. Drawings referenced in the following description schematically shows embodiments. Thus, scales of members, distances between members, and positional relation between members or the like may have been presented in an exaggerated manner, and illustration of a part of a member may have been omitted. In the following description, members that are the same or analogous will be given the same name or number in principle, and duplicative detailed descriptions will be appropriately omitted.

There is a light emitting device that emits pseudo-white light by using: a package with a recess; a light emitting element disposed on a bottom surface of the recess and emitting blue light; and a phosphor layer which is contained in a resin disposed in the recess and which absorbs the blue light and thereby emits yellow light.

The longer the length of light path from the light emitting element to an outer surface of the phosphor layer, the more the amount of the blue light absorbed in the phosphor while the blue light emitted from the light emitting element travels through the phosphor layer until the blue light exits from the outer surface of the phosphor layer. That means the amount of the yellow light emitted from the light emitting device will be increased. Therefore, a light emitting device having a longer light path in the phosphor layer emits more yellowish light.

When the phosphor layer is formed by potting a resin containing a phosphor over the light emitting element disposed on the bottom surface of the recess so as to seal the light emitting element, since in general a phosphor has higher specific gravity than that of a resin, the phosphor slowly settles down before the resin becomes hard, so that a lower portion of the hardened phosphor layer has a larger amount of phosphor than an upper portion of the hardened phosphor layer.

Consequently, a thin-profile light emitting device having a smaller vertical dimension than its horizontal dimension has unevenness in chromaticity distribution of light such that light emitted from lateral surfaces and portions near the lateral surfaces of the light emitting device appears yellowish compared to light emitted from a center portion of an upper surface of the light emitting device.

The recess of such a light emitting device is generally configured to have lateral surfaces the distance between which is large so that, when the light emitting element is mounted on the bottom surface of the recess, a collet holding the light emitting element would not collide with the recess. Also, the recess of such a light emitting device is generally configured to have lateral surfaces the distance between which is large so that, when the light emitting element and electrodes disposed in the recess are connected through wires, a wire bonder that bonds the wires would not collide with the package having the recess. Such a light emitting device with a recess having lateral surfaces the distance between which is large tends to have unevenness in chromaticity distribution of light.

A light emitting device manufacturing method according to an embodiment of the present disclosure makes it possible to adjust chromaticity distribution of light and provide a light emitting device whose chromaticity distribution of light has been adjusted.

First Embodiment

Configuration of Light Emitting Device

Figure 1B:
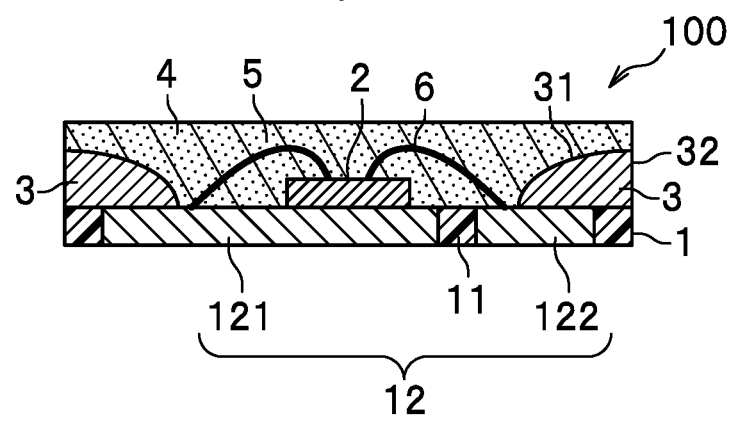
FIG. 1B is a schematic cross-sectional view showing the structure of the light emitting device according to the first embodiment, taken along line IB-IB in FIG. 1A.
Figure 1C:
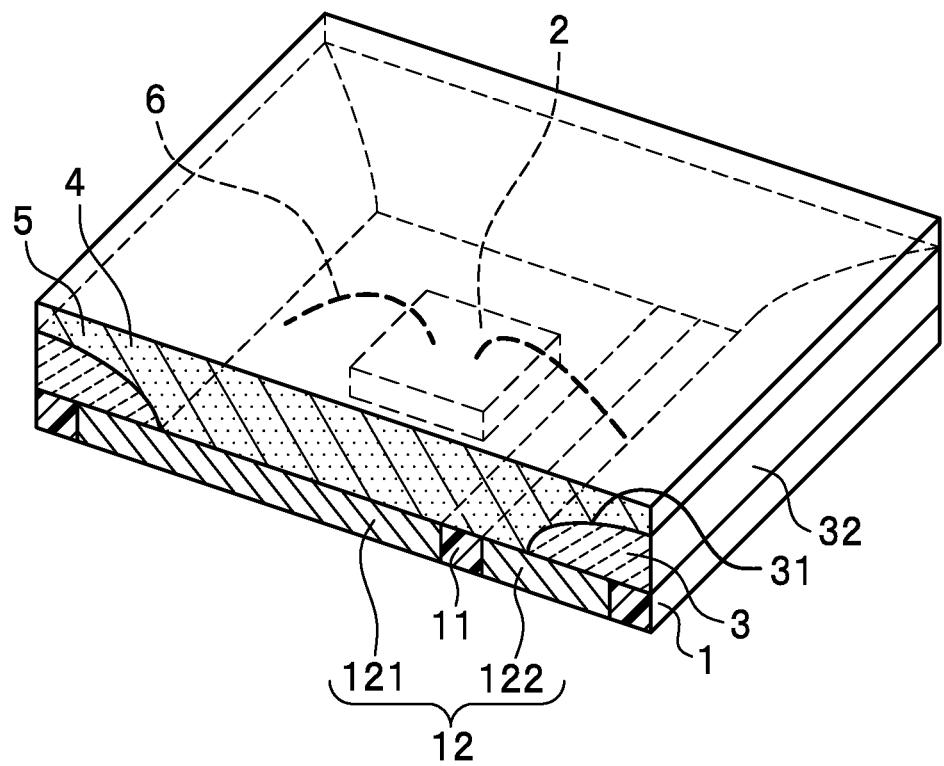
FIG. 1C is a schematic cross-sectional view showing the structure of the light emitting device according to the first embodiment, taken along line IC-IC in FIG. 1A.

Description will be given of a light emitting device according to a first embodiment of the present disclosure with reference to FIGS. 1A and 1B. FIG. 1A is a schematic plan view showing the structure of a light emitting device according to the first embodiment of the present disclosure. FIG. 1B is a schematic cross-sectional view showing the structure of the light emitting device according to the first embodiment, taken along line IB-IB in FIG. 1A. FIG. 1C is a schematic cross-sectional view showing the structure of the light emitting device according to the first embodiment, taken along line IC-IC in FIG. 1A. Note that, in FIG. 1A, members disposed below a sealing member 4 containing a phosphor 5 is illustrated seeing through the sealing member 4 and the phosphor 5.

An light emitting device 100 according to the first embodiment is of a substantially rectangular parallelepiped shape as a whole and mainly has: a base 1; a light emitting element 2 disposed on the base 1; a light-transmissive member 3 disposed on the base 1, the light-transmissive member 3 surrounding the light emitting element 2 with a gap in between the light-transmissive member 3 and the light emitting element 2; and a sealing member 4 that contains phosphor 5 and seals over the light-transmissive member 3 and the light emitting element 2.

The base 1 is constituted by a support member 11, a first electrode 121, and a second electrode 122 and is formed in a flat-plate shape. The first electrode 121 and the second electrode 122 are hereinafter sometimes referred collectively to as electrodes 12.

The support member 11 supports the first electrode 121 and the second electrode 122 in a predetermined arrangement. The support member 11 can be formed of an electrically-insulative resin material. Examples of the resin materials used for the support member 11 include a thermoplastic resin and a thermosetting resin. Examples of a thermoplastic resin used for the support member 11 include a polyphthalamide resin, a liquid crystal polymer, a polybutylene terephthalate (PBT), and an unsaturated polyester. Examples of a thermosetting resin used for the support member 11 include an epoxy resin, a modified epoxy resin, a silicone resin, and a modified silicone resin. Specifically a epoxy molding compound (EMC) is preferably used.

The electrodes 12, i.e., the first electrode 121 and the second electrode 122, can be formed by punching a metal plate made of Cu or Cu-based alloy. Note that surfaces of the first electrode 121 and the second electrode 122 may be Ag-plated. The first electrode 121 and the second electrode 122 are insulated from each other by the support member 11.

The first electrode 121 constitutes a middle portion of the base 1, on which the light emitting element 2 is bonded (dye-bonded). Bonding the light emitting element 2 on the first electrode 121 causes the first electrode 121 to serve as a thermal path through which the heat generated by the light emitting element 2 is transmitted to the outside.

The light emitting element 2 has two electrodes of different polarities, one of which is electrically connected through a wire 6 to an upper surface of the first electrode 121, and the other one of which is electrically connected through another wire 6 to an upper surface of the second electrode 122. The first electrode 121 and the second electrode 122 each have a lower surface exposed from the support member 11.

The light emitting element 2 is a light emitting diode (LED) that emits high-brightness blue light using a nitride semiconductor. The light emitting element 2 is of a face-up mounting type having positive and negative electrodes on an upper surface thereof (surface opposite to a lower surface of the light emitting element 2 which is to be joined to the base 1). The electrodes of the light emitting element 2 are connected through wires 6 to the first electrode 121 and the second electrode 122.

The light-transmissive member 3 is disposed to shorten the light path length of the sealing member 4 in a horizontal direction (left-right direction when viewed in cross-section perpendicular to a lengthwise direction of the light-transmissive member 3). Light emitted from the light emitting element 2 in an approximately horizontal direction travels along a light path extending from the light emitting element 2 through the sealing member 4 to a lateral surface of the light emitting device 100, where the light exits. The light path length of the sealing member 4 refers to the length of the light path in the sealing member 4. The light-transmissive member 3, which is disposed on the base 1, transmits at least 50% (preferably 70%) of the light from the light emitting element 2.

The light-transmissive member 3 is constituted by a single or plurality of light-transmissive members. In plan view, the light-transmissive member 3 may be continuously formed in a frame of a polygonal shape, such as a rectangle or hexagon, or in a frame of a circular shape. Alternatively, the light-transmissive member 3 may be constituted by two or more light-transmissive members, each of which has a shape of a line, a straight rod, or a rod having a bent or curbed portion.

The light emitting element 2 is spaced apart from the light-transmissive member 3 on the base 1. In the light emitting device 100 according to the first embodiment, the light-transmissive member 3 is disposed so that the light emitting element 2 is interposed between a pair of parts of the light-transmissive member 3 when viewed in cross section perpendicular to a lengthwise direction of the pair of parts of the light-transmissibe member 3. Here, the light emitting element 2 being interposed between the pair of parts of the light-transmissive member 3 means that the light-transmissive member 3 has a pair of opposing portions extending in a predetermined direction and the light emitting element 2 is located in between the opposing portions. The light-transmissive member 3 is disposed so that the light emitting element 2 is surrounded by the light-transmissive member 3 in plan view. In other words, the light-transmissive member 3 is of a frame-like structure and has four lateral portions, two of which constitute a first pair of opposing portions that extends in a predetermined direction and another two of which constitute a second pair of opposing portions that extends in a direction perpendicular to the predetermined direction. The light emitting element 2 is entirely surrounded by the light-transmissive member 3 by being interposed in between the first pair of opposing portions of the light-transmissive member and in between the second pair of opposing portions of the light-transmissive member 3.

Each of the four lateral portions of the light-transmissive member 3 has an inner lateral surface 31 located on a side of the lateral portion close to the light emitting element 2 (surface in contact with the later-described sealing member 4) and formed so as to have an arc shape or a curved shape protruding toward the sealing member 4 when viewed in cross-section perpendicular to a lengthwise direction of the lateral portion. In addition, each of the four lateral portions of the light-transmissive member 3 is formed so as to have an increasing horizontal width from top (side of the lateral portion away from the base 1) to bottom (side of the lateral portion close to the base 1) when viewed in cross-section perpendicular to a lengthwise direction of the lateral portion.

Meanwhile, each of the four lateral portions of the light-transmissive member 3 has an outer lateral surface 32 located opposite the light emitting element 2 and exposed outside as a portion of a (vertical) lateral surface of the light emitting device 100. It is to be noted that "exposed outside" here means that the outer lateral surface 32 of the light-transmissive member 3 is not sealed from the atmosphere by the sealing member 4. For example, even when the outer lateral surface 32 is coated (e.g., with silica) to suppress ingress of moisture, the outer lateral surface 32 is to be defined as being exposed.

Examples of the material used for the light-transmissive member 3 include a thermosetting resin, such as a silicone resin, an epoxy resin, and a urea resin, which have good light-transmissive properties, and a glass having light-transmissive properties. Specifically, a silicone resin is preferably used.

The light-transmissive member 3 may contain a light-diffusing material. When the light-transmissive member 3 contains a light-diffusing material, the content of the light-diffusing material is preferably at least 1% by mass and at most 20% by mass. A light-diffusing material with a content of less than 1% by mass fails to provide preferable light-diffusing properties. A light-diffusing material with a content of greater than 20% by mass causes a decrease in the light transmittance of the light-transmissive member 3. Thus the content of the light-diffusing material is preferably at least 1% by mass and at most 20% by mass, more preferably at least 2% by mass and at most 10% by mass, and still more preferably at least 2% by mass and at most 5% by mass.

The sealing member 4 protects the light emitting element 2 and the like from an external force, dust, moisture, and the like and provides good heat resistance, weather resistance, and light resistance to the light emitting element 2. The sealing member 4 transmits at least 50% (preferably 70%) of the light emitted from the light emitting element 2 and is provided so as to cover the inner lateral surface 31 of each of the lateral portions of the light-transmissive member 3, the light emitting element 2, and a portion of an upper surface of the base 1 exposed between the lateral portions of the light-transmissive member 3 and the light emitting element 2. Namely, the light emitting device 100 according to the first embodiment has an upper surface where the sealing member 4 is exposed. The light emitting device 100 has (vertical) lateral surfaces each including a lateral surface of a corresponding lateral portion of the light-transmissive member 3 and a lateral surface of the sealing member 4. Specifically, each of the lateral surfaces of the light emitting device 100 has a lower portion where the lateral surface of the corresponding lateral portion of the light-transmissive member 3 is exposed and has an upper portion where the lateral surface of the sealing member 4 is exposed, so that the lateral surface of the corresponding lateral portion of the light-transmissive member 3 and the lateral surface of the sealing member 4 are on the same plane. Note that, the surfaces of the sealing member 4 in contact with the atmosphere may be coated (e.g., with silica) to suppress ingress of moisture, but they are to be defined as being exposed.

Examples of the materials used for the sealing member 4 include a thermosetting resin, such as a silicone resin, an epoxy resin, and a urea resin, which have good light-transmissive properties, and a glass having light-transmissive properties. Specifically, a silicone resin is preferably used for the sealing member 4. As a silicone resin, a phenyl resin, phenyl rubber, modified silicone, fluororubber, methyl rubber, and phenyl gel may be used. Also, as a silicone resin, phenyl silicone having a refractive index of 1.45 to 1.60, methyl phenyl silicone having a refractive index of 1.40 to 1.50, or methyl silicone having a refractive index of 1.35 to 1.50 may be preferably used. Note that the materials of the light-transmissive member 3 and the sealing member 4 may be the same or different. The use of the same material for the light-transmissive member 3 and the sealing member 4 is advantageous in preventing light refraction occurring at a boundary (inner lateral surface 31) between the light-transmissive member 3 and the sealing member 4. Meanwhile, the use of different materials for the light-transmissive member 3 and the sealing member 4 is advantageous in increasing intensity of light in a desired direction by causing refraction of light to occur in the boundary (inner lateral surface 31) between the light-transmissive member 3 and the sealing member 4.

The sealing member 4 contains a phosphor 5, which is dispersed in the sealing member 4. The sealing member 4 containing particles of the phosphor 5 facilitates adjustment of the color tone of the light emitting device 100. As the phosphor 5, a phosphor which has a specific gravity heavier than that of the sealing member 4 and which absorbs light from the light emitting element 2 and performs wavelength conversion may be used. A phosphor 5 having a specific gravity heavier than that of the sealing member 4 may be settled down to be arranged in the vicinity of a surface of the light emitting element 2.

Examples of the phosphor 5 contained in the sealing member 4 include a yellow phosphor, such as $Y_3Al_5O_{12}$:Ce (YAG) and silicate, and a red phosphor such as $CaAlSiN_3$:Eu (CASN), $(Sr,Ca)AlSiN_3$:Eu (SCASN), and $K_2SiF_6$:Mn (KSF).

The wires 6 electrically connect electrodes of the light emitting element 2 and the electrodes 12 of the base 1. Note that an end of each of the wires 6 is connected to a corresponding electrode of the light emitting element 2 at a bonding point thereof and the other end of the wire 6 is connected to a corresponding electrode of the electrodes 12 at a bonding point thereof. These bonding points are covered by the sealing member 4.

The light emitting device 100 thus structured performs wavelength conversion on a part of the light emitted from the light emitting element 2 by the phosphor 5 contained in the sealing member 4. The converted light exits from the upper surface and the lateral surfaces of the light emitting device 100. The light emitting device 100 provided with the light-transmissive member 3 is able to emit light whose unevenness in chromaticity distribution has been adjusted.

Light Emitting Device Manufacturing Method

Figure 2:
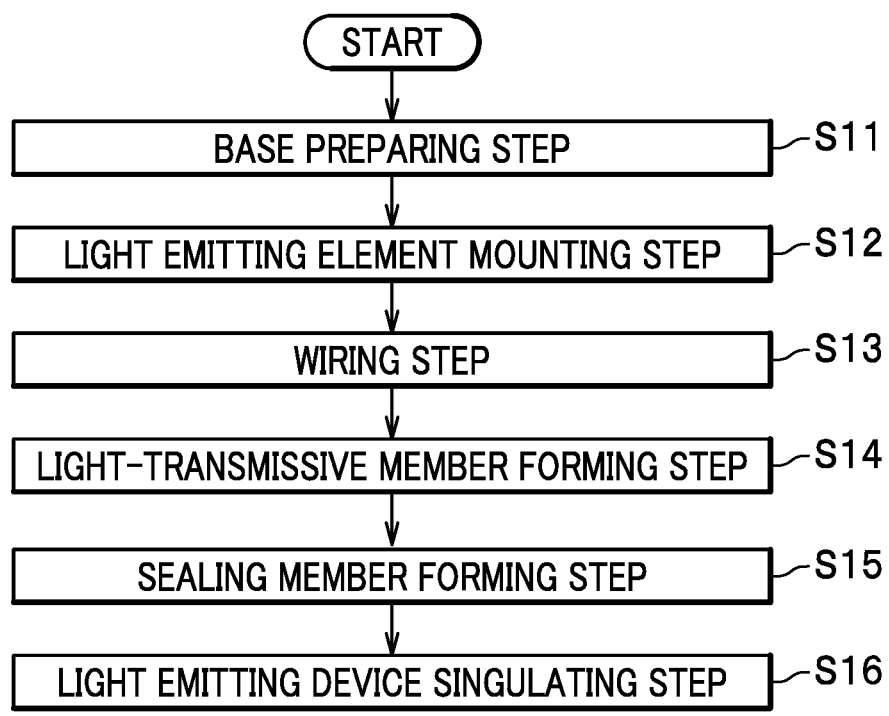
FIG. 2 is a flowchart showing a procedure of a method for manufacturing the light emitting device according to the first embodiment.
Figure 3A:
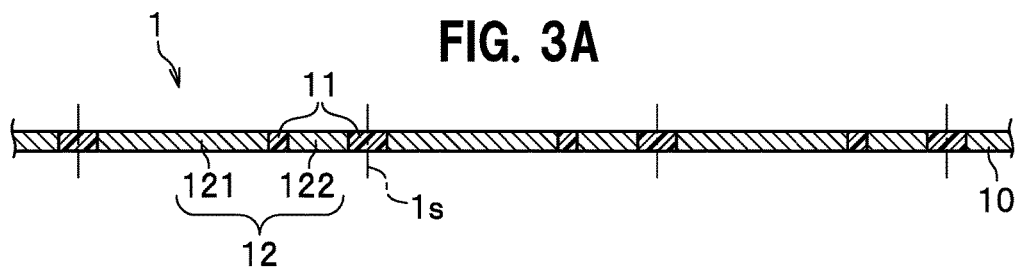
FIG. 3A is a schematic cross-sectional view showing an aspect of a base preparing step of the method for manufacturing the light emitting device according to the first embodiment.
Figure 3B:
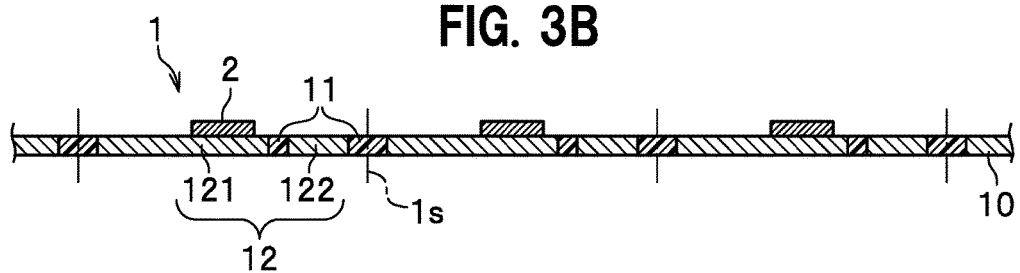
FIG. 3B is a schematic cross-sectional view showing an aspect of a light emitting element mounting step of the method for manufacturing the light emitting device according to the first embodiment.
Figure 3C:
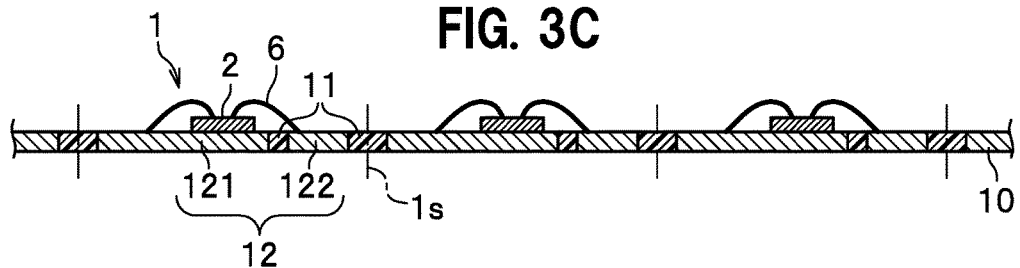
FIG. 3C is a schematic cross-sectional view showing an aspect of a wiring step of the method for manufacturing the light emitting device according to the first embodiment.
Figure 3D:
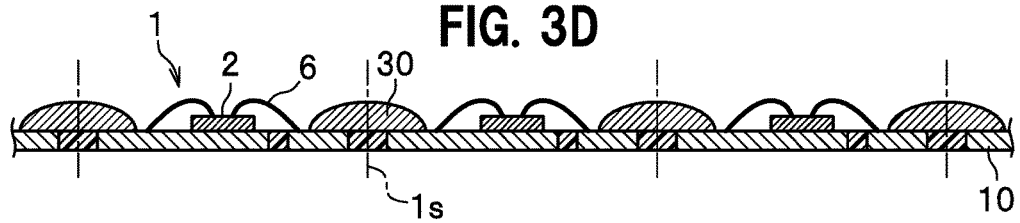
FIG. 3D is a schematic cross-sectional view showing an aspect of a light-transmissive member forming step of the method for manufacturing the light emitting device according to the first embodiment.
Figure 3E:
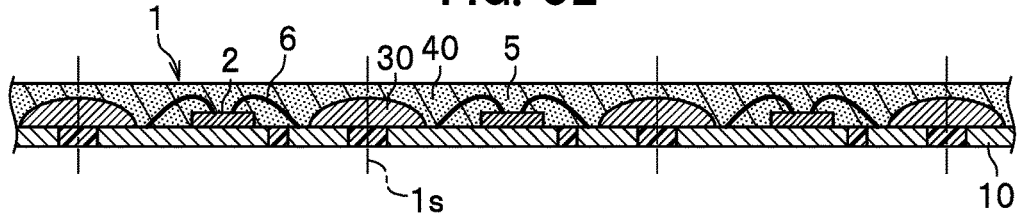
FIG. 3E is a schematic cross-sectional view showing an aspect of a sealing member forming step of the method for manufacturing the light emitting device according to the first embodiment.
Figure 3F:
FIG. 3F is a schematic cross-sectional view showing an aspect of a light emitting device singulating step of the method for manufacturing the light emitting device according to the first embodiment.

Next, description will be given of a method for manufacturing the light emitting device 100 according to the first embodiment with reference to FIGS. 2 to 3F. FIG. 2 is a flowchart showing a procedure of a method for manufacturing the light emitting device according to the first embodiment. FIG. 3A is a schematic cross-sectional view showing an aspect of a base preparing step of the method for manufacturing the light emitting device according to the first embodiment. FIG. 3B is a schematic cross-sectional view showing an aspect of a light emitting element mounting step of the method for manufacturing the light emitting device according to the first embodiment. FIG. 3C is a schematic cross-sectional view showing an aspect of a wiring step of the method for manufacturing the light emitting device according to the first embodiment. FIG. 3D is a schematic cross-sectional view showing an aspect of a light-transmissive member forming step of the method for manufacturing the light emitting device according to the first embodiment. FIG. 3E is a schematic cross-sectional view showing an aspect of a sealing member forming step of the method for manufacturing the light emitting device according to the first embodiment. FIG. 3F is a schematic cross-sectional view showing an aspect of a light emitting device singulating step of the method for manufacturing the light emitting device according to the first embodiment.

The method for manufacturing a light emitting device according to the present embodiment include the steps of: a base preparing step S11, a light emitting element mounting step S12, a wiring step S13, a light-transmissive member forming step S14, a sealing member forming step S15, and a light emitting device singulating step S16.

In the method for manufacturing the light emitting device according to the present embodiment, a base connected body 10 in which a plurality of bases 1 are continuously formed is processed from the base preparing step S11 to the sealing member forming step S15. After light emitting devices 100 are respectively produced on the bases 1, individual light emitting devices 100 are singulated in the light emitting device singulating step S16. Alternatively, only one base 1 or plural singulated bases 1 may be used to produce one light emitting device 100 or plural light emitting devices 100.

In the base preparing step S11, a base connected body 10, in which a plurality of bases 1 with no light emitting element 2 or the like are formed, is prepared. The base connected body 10 (base 1) can be prepared by: punching a metal plate to form a read frame in which first electrodes 121 and second electrodes 122 are formed; sandwiching the lead frame by an upper part and a lower part of a two-piece mold having cavities corresponding to the shapes of support members 11; and injecting a resin into the cavities of the mold to form a resin body.

As described, the base connected body 10 (base 1) is a resin package. Alternatively, the base connected body 10 may be a ceramic package formed by stacking and then sintering green sheets, each of which is made of a raw material of the ceramic. The base connected body 10 may be produced by forming an electrically conductive film by applying a metal foil to or plating a metal on a flat base made of a ceramic material or a resin material and then forming a wiring pattern on the electrically conductive film by etching. The base connected body 10 (base 1) may be provided by purchasing.

In the light emitting element mounting step S12, light emitting elements 2 are picked up and placed on the base connected body 10 (base 1) at predetermined locations using a collet or the like, and the base connected body 10 (base 1) on which the light emitting elements 2 are disposed is subjected to a heating process using a reflow furnace to join the light emitting elements 2 onto the base connected body 10 (base 1).

In the wiring step S13, terminals of each of the light emitting elements 2 are electrically connected through wires 6 to the first electrode 121 and the second electrode 122 of the corresponding base 1, which serve as electrodes for external connection. The wires 6 can be wired with a wire bonding machine.

In the light-transmissive member forming step S14, hardening composition is supplied onto the base connected body 10 (base 1) using a dispenser, then the hardening composition is hardened to form a light-transmissive member base body 30, from which light-transmissive members 3 are created later. The light-transmissive member base body 30 is disposed along boundaries is of bases 1 so as to surround respective light emitting elements 2 in a grid shape. The dispenser is used to dispose the light-transmissive member base body 30 by for example linear coating an upper surface of the base connected body 10 (base 1) along the boundaries is of bases 1 in a grid pattern with the hardening composition. The hardening composition of the light-transmissive member base body 30 is prepared so as to have a predetermined hardness, applied from the dispenser by linear coating, and then hardened, so that the hardened composition has a cross section having a curved shape. The hardening composition of the light-transmissive member base body 30 may be applied to only either rows or columns of the matrix in the grid shape by linear coating.

In the sealing member forming step S15, hardening composition containing a phosphor 5 is supplied by a dispenser onto upper surfaces and lateral surfaces of the light emitting elements 2, an upper surface and lateral surfaces of the light-transmissive member base body 30, and an upper surface of the base connected body 10 (base 1) exposed between rows and columns of the light-transmissive member base body 30. After that, the hardening composition is hardened to form a sealing member base body 40, from which sealing members 4 are created later. Here, the sealing member base body 40 is formed so as to have a height higher than that of the light-transmissive member base body 30. That is, the hardening composition containing a phosphor 5 can be supplied over the grid-shaped light-transmissive member base body 30. This improves productivity.

In the light emitting device singulating step S16, light emitting devices 100, which have been formed in connection with each other, are singulated (diced). The light emitting devices 100 are singulated by cutting the base connected body 10 along the boundaries is of the bases 1 using a cutter or the like. In other words, the cutting is performed along paths on which the light-transmissive member base body 30 has been disposed to singulate the light emitting devices 100. The light emitting devices 100 are manufactured by carrying out the above-described steps.

These steps allow each of the light emitting elements 2 and the corresponding light-transmissive member 3 to have a small distance therebetween. Specifically, the light-transmissive member forming step S14 is carried out after the light emitting element mounting step S12 and the wiring step S13 have been carried out. This allows arranging the light emitting elements 2, the light-transmissive member 3, and the wires 6 so that the light emitting element 2 and the light-transmissive member 3 have a small distance therebetween and each of the wires 6 and the light-transmissive member 3 have a small distance therebetween. Arranging the light emitting element 2 and the light-transmissive member 3 to have a small distance therebetween enables to adjust an amount of the phosphor 5 in the sealing member 4 present in the horizontal direction of the light emitting element 2, and thus to adjust unevenness in chromaticity distribution of light.

While a method for manufacturing a light emitting device 100 according to the first embodiment has been described, it should be noted that the method is not limited thereto, and the method may include other steps before, after, or between the steps described.

Although, in the light-transmissive member forming step S14, the light-transmissive member base body 30 has been described as being formed so as to not contain bonding points between the wires 6 and the electrodes 12 (121, 122), and the bonding points have been described as being covered by the sealing member 4 later (see FIGS. 1A and 1B), it should be noted that the method is not limited thereto.

Figure 4A:
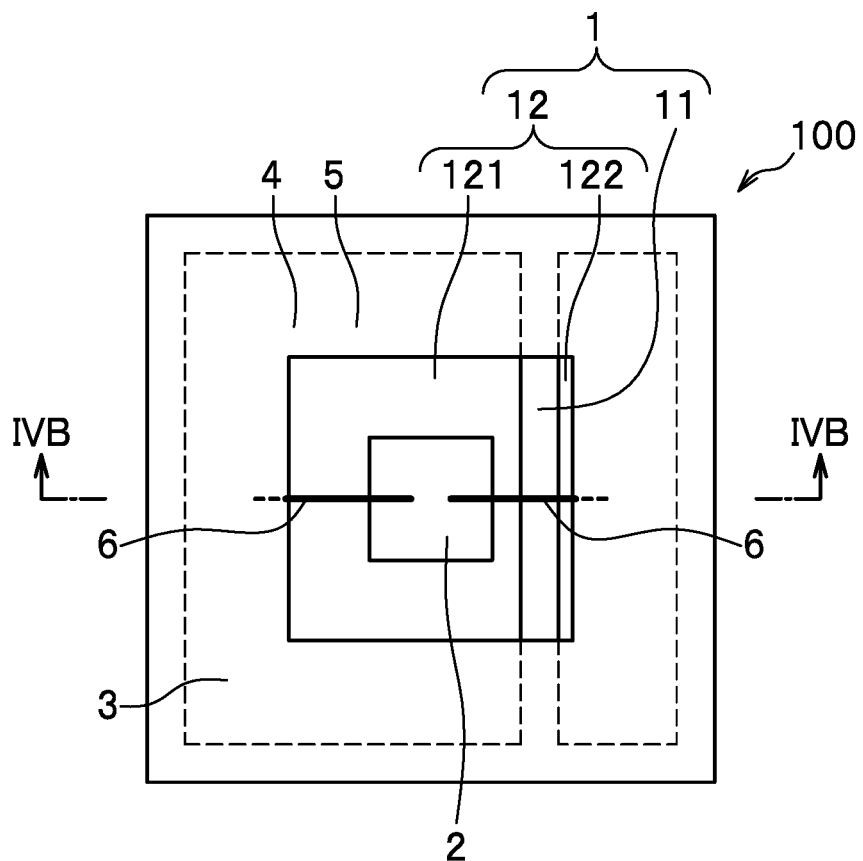
FIG. 4A is a schematic plan view showing the structure of a light emitting device according to a modified embodiment of the first embodiment.
Figure 4B:
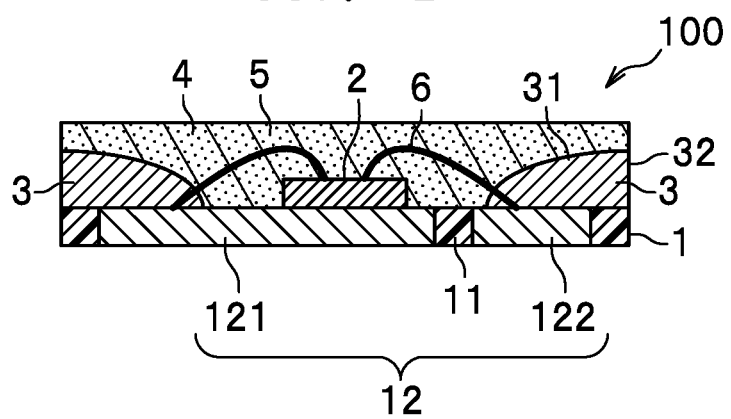
FIG. 4B is a schematic cross-sectional view showing the structure of the light emitting device according to the modified embodiment of the first embodiment, taken along line IVB-IVB in FIG. 4A.

FIG. 4A is a schematic plan view showing a light emitting device according to a modified embodiment of the first embodiment. FIG. 4B is a schematic cross-sectional view showing the structure of the light emitting device according to the modified embodiment of the first embodiment, taken along line IVB-IVB in FIG. 4A. Note that, in FIG. 4A, members disposed below a sealing member 4 containing a phosphor 5 is illustrated seeing through the sealing member 4 and the phosphor 5.

In the light-transmissive member forming step S14 of the modified embodiment, the light-transmissive member base body 30 may be formed so as to contain bonding points between the wires 6 and the electrodes 12 (121, 122), so that the light-transmissive member 3 contains the bonding points (see FIGS. 4A and 4B).

Namely, after the wiring step S13, in the light-transmissive member forming step S14, hardening composition is supplied onto the base connected body 10 (base 1) using a dispenser, then a light-transmissive member base body 30, from which a light-transmissive member 3 is created later, is formed so that each of the four lateral portions of the light-transmissive member 3 has a large width when viewed in cross-section perpendicular to a lengthwise direction of the lateral portion. In other words, the distance between a lateral surface of the light emitting element 2 and the inner lateral surface 31 of the corresponding lateral portion of the light-transmissive member 3 is made smaller than that of the light emitting device 100 illustrated in FIGS. 1A and 1B. That means, the length of a light path in the horizontal direction in the sealing member 4 is made smaller.

Optical Simulation

Figure 5A:
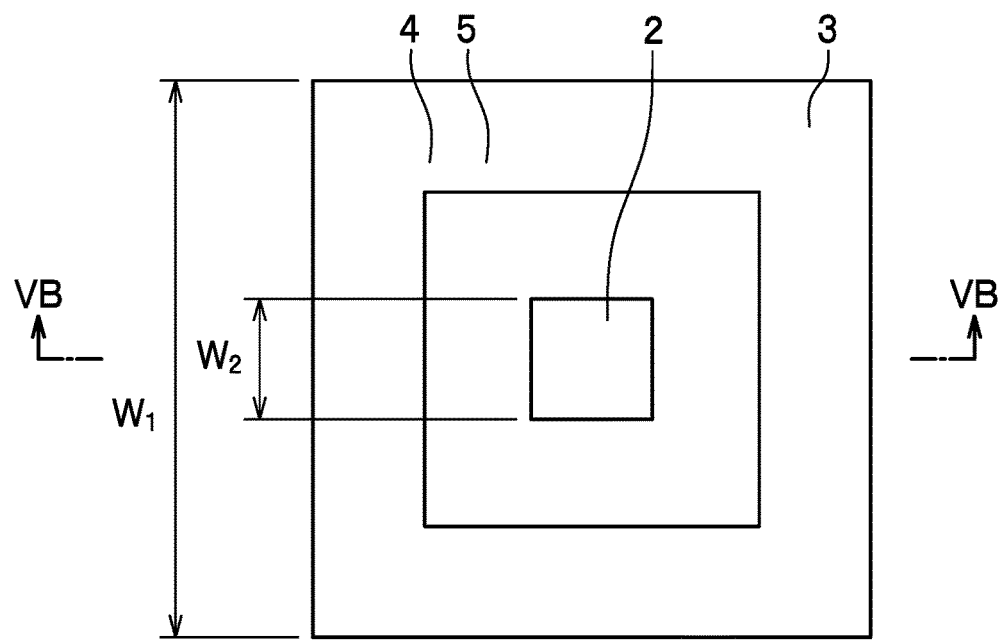
FIG. 5A is a schematic plan view illustrating parameters of a light emitting device to be simulated.
Figure 5B:
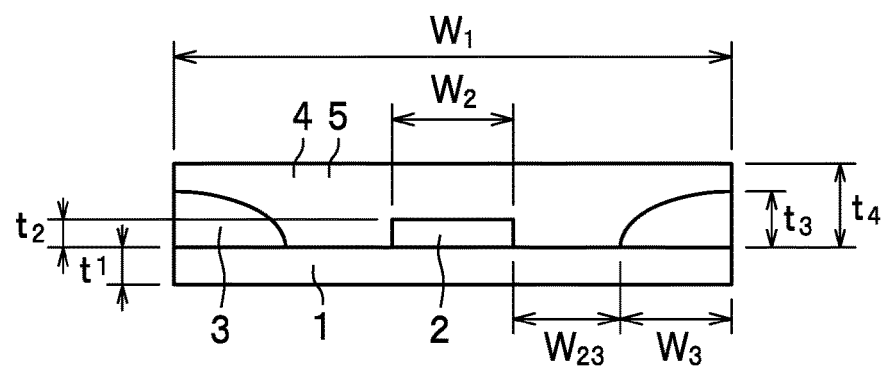
FIG. 5B is a schematic cross-sectional view illustrating parameters of the light emitting device to be simulated, taken along line VB-VB in FIG. 5A.
Figure 6:
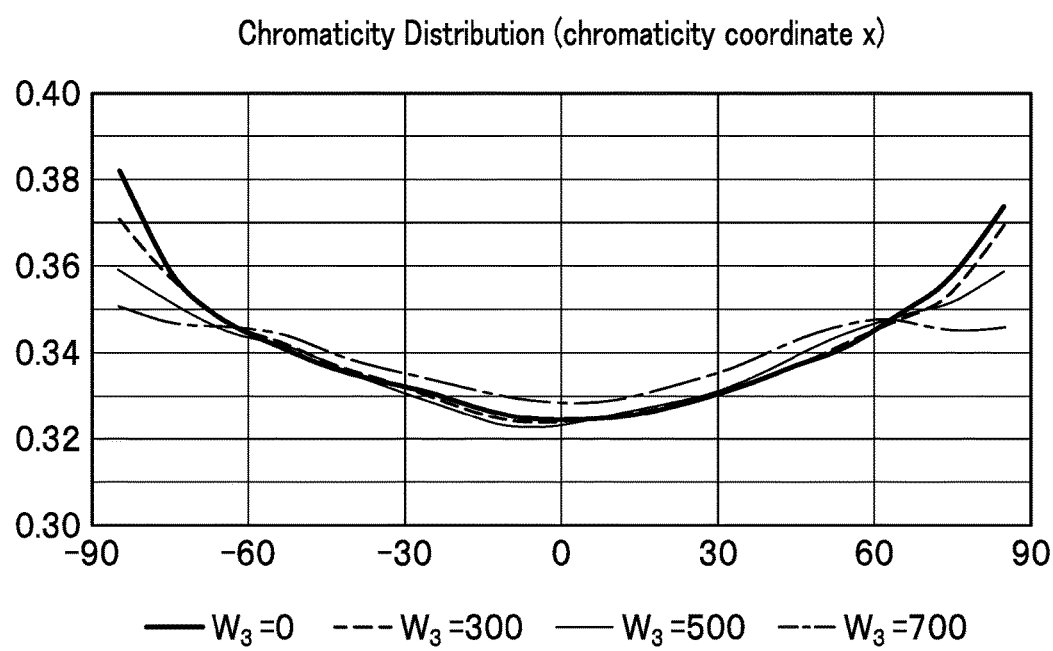
FIG. 6 is a graph showing relations between directional angles and chromaticity distribution of light emitting devices having light-transmissive members with different widths.

A simulation was conducted to verify the working effect of the light emitting device 100 according to the first embodiment and the modified embodiment thereof. FIG. 5A is a schematic plan view illustrating parameters of a light emitting device to be simulated. FIG. 5B is a schematic cross-sectional view illustrating parameters of the light emitting device to be simulated, taken along line VB-VB in FIG. 5A. Note that, in FIG. 5A, members disposed below a sealing member 4 containing a phosphor 5 is illustrated seeing through the sealing member 4 and the phosphor 5. FIG. 6 is a graph showing relations between directional angles and chromaticity (chromaticity coordinate x) of light emitted from light emitting devices having light-transmissive members with different widths $W_3$. In FIG. 6, the abscissa represents the directional angle θ in the range of ±85° and the ordinate represents the chromaticity of light (chromaticity coordinate x). Note that the directional angle θ is relative to the light axis (θ=0°) of the light emitting element 2. Note that the graph plots the chromaticity coordinate x only. The relations of other values (chromaticity coordinate y, Y color value and the like) to the directional angle have tendencies similar to the one shown in FIG. 6 and thus illustration of those relations are omitted.

The simulation was conducted using the parameters according to the following conditions. It was assumed that, as to the light emitting device 100 to be simulated, when viewed in plan, the light emitting device 100 and the light emitting element 2 each had a square shape; a length $W_1$ of each of the four laterals of the light emitting device 100 (in other words, the width of the base 1) was 3000 μm; a length $W_2$ of each of the four laterals of the light emitting element 2 was 650 μm; and that the light emitting element 2 was positioned at the center of the base 1.

It was assumed that, as to the light emitting device 100 to be simulated, when viewed in vertical cross-section, the base 1 had a thickness t1 of 200 μm; the light emitting element 2 had a thickness $t_2$ of 150 μm; the light-transmissive member 3 had a thickness $t_3$ of 300 μm, where $t_3$ was defined as the height of the outer lateral surface 32, which was a portion of the light-transmissive member 3 exposed in a lateral surface of the light emitting device 100; the sealing member 4 covered a portion of the upper surface of the base 1 and had a thickness $t_4$ of 450 μm, where $t_4$ was defined as the height of the upper surface of the sealing member 4 from the upper surface of the base 1.

The simulation was conducted varying the width $W_3$ of the light-transmissive member 3 as 0, 300, 500, and 700 μm, where $W_3$ was defined as the width of a lower surface of each of the four lateral portions of the light-transmissive member 3, which lower surface is in contact with the base 1, as viewed in cross-section perpendicular to a lengthwise direction of the lateral portion. Note that $W_3$ being 0 μm means that the light emitting device 100 is sealed by the sealing member 4 without having a light-transmissive member 3. It was assumed that the light emitting element 2 and the light-transmissive member 3 have a distance $W_{23}$ therebetween, where $W_{23}$ was defined as the minimum distance between a lateral surface of the light emitting element 2 and the inner lateral surface 31 of the lateral portion of the light-transmissive member 3 facing the lateral surface of the light emitting element 2. In other words, $W_{23}=W_1/2-W_2/2-W_3=1175-W_3$.

It was assumed that a cross-section of the inner lateral surface 31 of a lateral portion of the light-transmissive member 3, shown in the cross-sectional view in FIG. 5B, was shaped in a quarter ellipse whose first radius is $t_3$ and whose second radius is $W_3$. It was assumed that the light emitting element 2 is a single wavelength light source emitting a wavelength of 450 nm. It was assumed that the material for the light-transmissive member 3 was a phenyl silicone, and that the material for the sealing member 4 was a phenyl silicone in which $Y_3Al_5O_{12}$:Ce (YAG) was dispersed as a phosphor 5. The number of phosphor particles in the sealing member of each light emitting device 100 was adjusted so that the light emitting device 100 has a chromaticity coordinate x of about 0.345 at directional angles θ of ±60°.

Incidentally, pseudo-white light composed of blue light and yellow light and having a larger amount of yellow light has a greater value of chromaticity coordinate x. A light emitting device 100 is said to have smaller unevenness in chromaticity distribution of light when there is a smaller variation in chromaticity (chromaticity coordinate x) relative to a variation of the directional angle θ, in other words, when there is a smaller difference between a maximum value and a minimum value of chromaticity (chromaticity coordinate x).

The result of the simulation is as follows. The light emitting device 100 with no light-transmissive member 3 ($W_3=0$ μm) had a difference of 0.06 between a maximum value 0.38 and a minimum value 0.32 of the chromaticity coordinate x. In contrast, the light emitting device 100 with a light-transmissive member 3 having a width $W_3$ of 300 μm had a difference of 0.05 between a maximum value 0.37 and a minimum value 0.32 of the chromaticity coordinate x. The light emitting device 100 with a light-transmissive member 3 having a width $W_3$ of 500 μm had a difference of 0.04 between a maximum value 0.36 and a minimum value 0.32 of the chromaticity coordinate x. The light emitting device 100 with a light-transmissive member 3 having a width $W_3$ of 700 μm had a difference of 0.02 between a maximum value 0.35 and a minimum value 0.33 of the chromaticity coordinate x. As shown in the result, a light emitting device 100 with a light-transmissive member 3 having a larger width $W_3$, in other words, a light emitting device 100 with a light emitting element 2 and a light-transmissive member 3 having a smaller distance $W_{23}$ therebetween, has a smaller difference between a maximum value and a minimum value of the chromaticity coordinate x.

As shown, the light emitting device 100 according to the first embodiment can have adjusted unevenness in chromaticity distribution by having the light-transmissive member 3. In particular, as described in the description of the light-transmissive member forming step S14, the light-transmissive member base body 30 (light-transmissive member 3) is formed by supplying hardening composition onto the base 1 by linear coating or the like after the wires 6 are bonded, so that the light emitting element 2 and the light-transmissive member 3 can have a distance $W_{23}$ therebetween of at most three-quarters (more preferably of about one-quarter) the width $W_2$ of a lateral of the light emitting element 2 and thus the light emitting device 100 can have preferably adjusted unevenness in chromaticity distribution.

Preferably, the width $W_3$ of the light-transmissive member is at least 50 μm and the height (thickness) $t_3$ of the light-transmissive member 3 is at least 50 μm as viewed in cross-section perpendicular to a lengthwise direction of a lateral portion of the light-transmissive member 3. With a light-transmissive member 3 not meeting the above condition, the unevenness in chromaticity distribution is not sufficiently adjusted.

Preferably, the sealing member 4 has a thickness of at least 50 μm above the light emitting element 2, i.e., $t_4-t_2 \geq 50$ μm. With a sealing member 4 not meeting the above condition, there is no sufficient effect of the sealing member 4 in protecting the light emitting element 2 and the like from an external force, dust, moisture, and the like.

Preferably, the thickness of the sealing member 4 directly above the light-transmissive member 3 (i.e., $t_4-t_3$) is at least 30 μm and at most 3 mm, more preferably at least 50 μm and at most 1 mm, and still more preferably at least 100 μm and at most 500 μm.

Preferably, the light-transmissive member 3 has a height (thickness) $t_3$ the ratio of which to the width $W_3$ of the light-transmissive member 3 is at least 0.3 and at most 2.0. With this structure, chromaticity distribution is favorably adjusted.

Preferably, the ratio of $W_{23}$ to $(t_4-t_2)$ is at least 0.8 and at most 2.0, where $W_{23}$ is the distance between an inner lateral surface 31 of a lateral portion of the light-transmissive member 3 and the lateral surface of the light emitting element 2 facing the inner lateral surface 31, and $(t_4-t_2)$ is the thickness of the sealing member 4 directly above the light emitting element 2. With this structure, a part of light emitted in a vertically upward direction and a part of light emitted in a horizontal direction have approximately the same length of light path in the sealing member 4, or the former has a longer light path in the sealing member 4 than that of the latter. This facilitates adjustment of chromaticity distribution of light.

Preferably, the sealing member 4 has a height (thickness) $t_4$ the ratio of which to the height (thickness) $t_2$ of the light emitting element 2 is at least 1.2 and at most 6.0. With this structure, a part of light emitted in a vertically upward direction has a longer light path and thus the light-transmissive member 3 can have a smaller width $W_3$ to adjust chromaticity distribution of light. Namely, chromaticity distribution of light can be more easily adjusted.

Second Embodiment

Configuration of Light Emitting Device

Figure 7A:
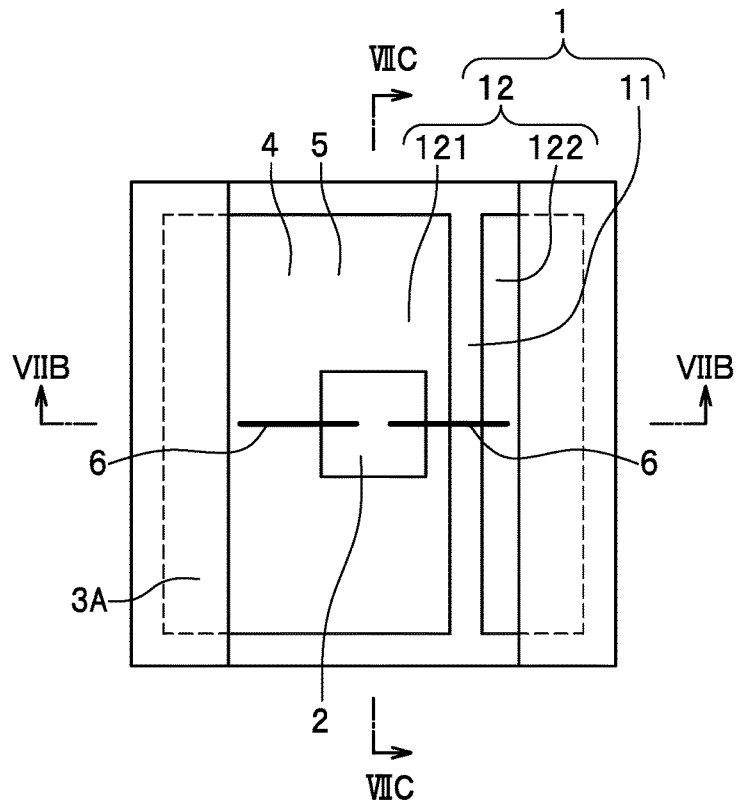
FIG. 7A is a schematic plan view showing the structure of a light emitting device according to a second embodiment of the present disclosure.
Figure 7B:
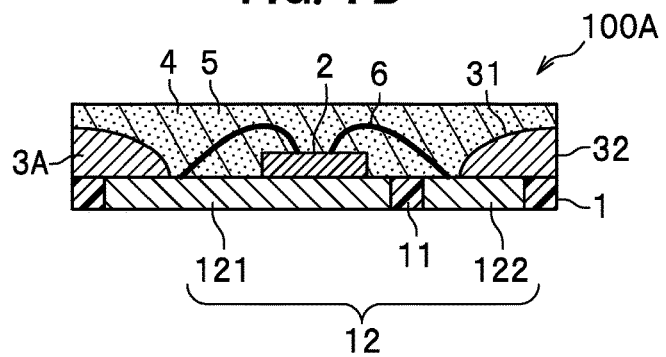
FIG. 7B is a schematic cross-sectional view showing the structure of the light emitting device according to the second embodiment, taken along line VIIB-VIIB in FIG. 7A.
Figure 7C:
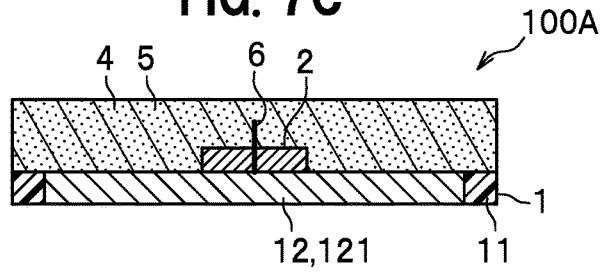
FIG. 7C is another schematic cross-sectional view showing the structure of the light emitting device according to the second embodiment, taken along line VIIC-VIIC in FIG. 7A.

Description will be given of a light emitting device 100A according to a second embodiment with reference to FIGS. 7A and 7B. FIG. 7A is a schematic plan view showing the structure of a light emitting device according to the second embodiment of the present disclosure. FIG. 7B is a schematic cross-sectional view showing the structure of the light emitting device according to the second embodiment, taken along line VIIB-VIIB in FIG. 7A. FIG. 7C is a schematic cross-sectional view showing the structure of the light emitting device according to the second embodiment, taken along line VIIC-VIIC in FIG. 7A. Note that, in FIG. 7A, members disposed below a sealing member 4 containing a phosphor 5 are illustrated seeing through the sealing member 4 and the phosphor 5.

In the light emitting device 100 according to the first embodiment, the light-transmissive member 3 is provided so that the light emitting element 2 is surrounded by the four lateral portions of the light-transmissive member 3. In contrast, a light emitting device 100A according to the second embodiment has two light-transmissive members 3A. Specifically, in the light-transmissive member forming step S14, the light-transmissive member base body 30 is formed in a plurality of parallel rows rather than rows and columns of a grid, by linear coating or the like. Namely, in the light emitting device 100A according to the second embodiment, a pair of light-transmissive members 3A extending in a predetermined direction are provided such that, as viewed in cross-section perpendicular to the predetermined direction, the light emitting element 2 is interposed between the pair of light-transmissive members 3A. The pair of light-transmissive members 3A corresponds to a pair of lateral portions of the light-transmissive member 3 according to the first embodiment. Even with such a structure of the light emitting device 100A, light chromaticity distribution in directional angles perpendicular to the predetermined direction can be adjustable.

Third Embodiment

Configuration of Light Emitting Device

Figure 8:
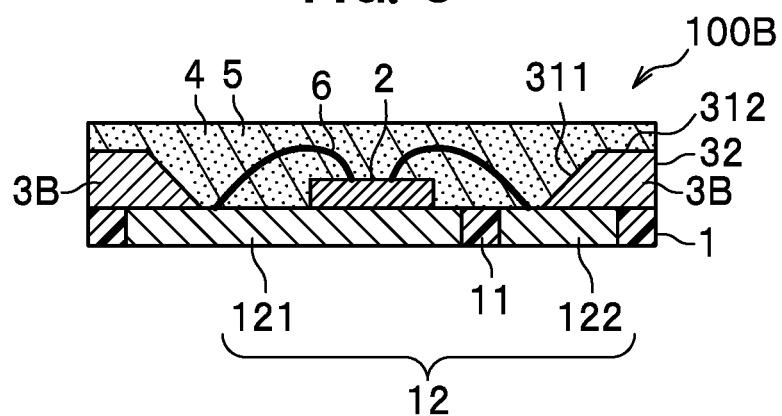
FIG. 8 is a schematic cross-sectional view showing the structure of a light emitting device according to a third embodiment of the present disclosure.
Figure 9:
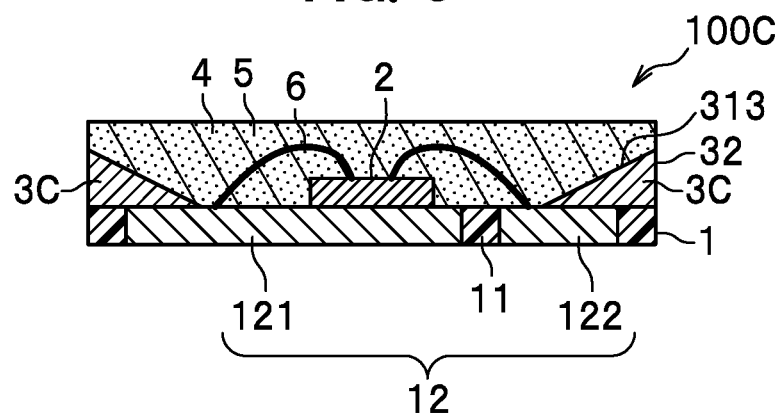
FIG. 9 is a schematic cross-sectional view showing the structure of a light emitting device according to a modified embodiment of the third embodiment.

Description will be given of light emitting devices 100B and 100C according to a third embodiment with reference to FIGS. 8 and 9. FIG. 8 is a schematic cross-sectional view showing the structure of a light emitting device according to the third embodiment of the present disclosure. FIG. 9 is a schematic cross-sectional view showing the structure of a light emitting device according to a modified embodiment of the third embodiment.

In the light emitting device 100 according to the first embodiment, the inner lateral surface 31 of each of the four lateral portions of the light-transmissive member 3 has an arc shape or a curved shape when viewed in cross-section perpendicular to a lengthwise direction of the lateral portion. Likewise, in the light emitting device 100A according to the second embodiment, the inner lateral surface 31 of each of the pair of light-transmissive members 3A has an arc shape or a curved shape when viewed in cross-section perpendicular to a lengthwise direction of the light-transmissive member 3A. A light emitting device 100B according to the third embodiment has a light-transmissive member 3B having four lateral portions like the first embodiment. However, each of the four lateral portions has a flat inner lateral surface 311 and a flat upper surface 312 such that, when viewed in cross-section perpendicular to a lengthwise direction of the lateral portion, the flat inner lateral surface 311 and the flat upper surface 312 each have a linear shape and as a result the lateral portion has a trapezoidal shape. A light emitting device 100C according to a modified embodiment of the third embodiment has a light-transmissive member 3C having four lateral portions like the first embodiment. However, each of the four lateral portions of the light-transmissive member 3C has a flat inner lateral surface 313 such that, when viewed in cross-section perpendicular to a lengthwise direction of the lateral portion, the flat inner lateral surface 313 has a linear shape extending from a lateral surface of the light emitting device 100C to the base 1 and as a result the lateral portion has a triangular shape. Specifically, in the light-transmissive member forming step S14, hardening composition is supplied onto the base connected body 10 (base 1) by linear coating or the like, and then the hardening composition is processed so as to have a predetermined shape before or after the hardening composition is hardened. Chromaticity distribution can be adjustable with those structures.

When the material (hardening composition) of the light-transmissive member(s) (light-transmissive member(s) 3, 3A, 3B, or 3C) and the material (hardening composition) of the sealing member 4 are different from each other, light refraction occurs at a boundary between the light-transmissive member(s) and the sealing member 4. The boundary between the light-transmissive member(s) and the sealing member 4, i.e., the inner lateral surface of each of the lateral portions of the light-transmissive member(s) can be designed so as to control the refraction of light to have desired luminance distribution.

Note that the shape of the inner lateral surface of each of the four lateral portions of the light-transmissive member(s) (light-transmissive member(s) 3, 3A, 3B, or 3C) is not limited to the above-described shapes. For example, the inner lateral surface may be formed so as to have grooves or surface unevenness.

Fourth Embodiment

Configuration of Light Emitting Device

Figure 10A:
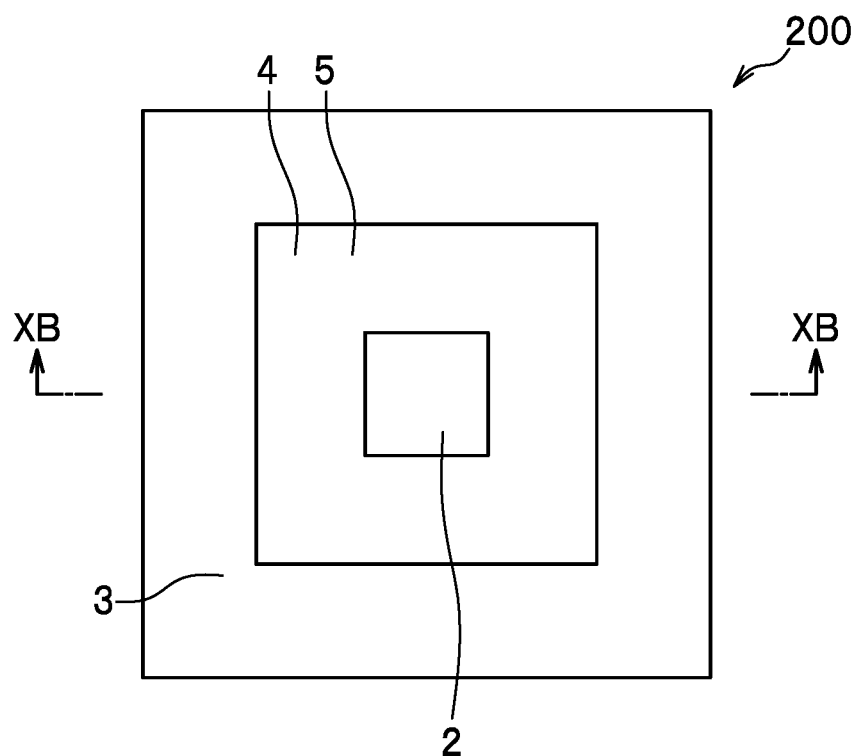
FIG. 10A is a schematic plan view showing the structure of a light emitting device according to a fourth embodiment of the present disclosure.
Figure 10B:
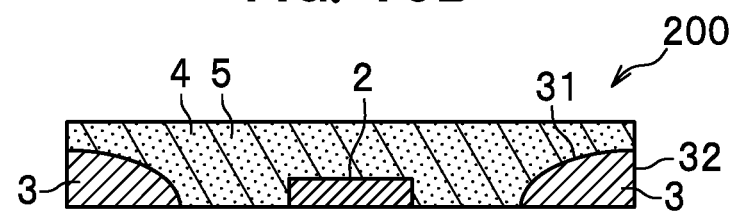
FIG. 10B is a schematic cross-sectional view showing the structure of the light emitting device according to the fourth embodiment, taken along line XB-XB in FIG. 1A.

Description will be given of a light emitting device 200 according to a fourth embodiment with reference to FIGS. 10A and 10B. FIG. 10A is a schematic plan view showing the structure of a light emitting device according to the fourth embodiment of the present disclosure. FIG. 10B is a schematic cross-sectional view showing the structure of the light emitting device according to the fourth embodiment, taken along line XB-XB in FIG. 10A. Note that, in FIG. 10A, members disposed below a sealing member 4 containing a phosphor 5 are illustrated seeing through the sealing member 4 and the phosphor 5.

An light emitting device 200 according to the fourth embodiment is of a substantially rectangular parallelepiped shape as a whole and mainly has: a light emitting element 2; a light-transmissive member 3 arranged so as to surround the light emitting element 2 with a gap in between the light-transmissive member 3 and the light emitting element 2; and a sealing member 4 that covers an upper surface of the light-transmissive member 3 and an upper surface and lateral surfaces of the light emitting element 2.

The light emitting element 2 of the light emitting device 200 according to the fourth embodiment is a light emitting diode that emits high-brightness blue light using a nitride semiconductor. The light emitting element 2 is of a face-down mounting type having positive and negative electrodes on an lower surface thereof (surface opposite to the surface covered by the sealing member 4). The light emitting element 2 emits light when electrical power is supplied through the electrodes of the light emitting element 2.

The light-transmissive member 3 is spaced apart from the light emitting element 2. In the light emitting device 200 according to the fourth embodiment, the light-transmissive member 3 has four lateral portions, two of which constitute a first pair of opposing portions that extends in a predetermined direction and another two of which constitute a second pair of opposing portions that extends in a direction perpendicular to the predetermined direction. The light emitting element 2 is entirely surrounded by the light-transmissive member 3 by being interposed in between the first pair of opposing portions of the light-transmissive member 3 and in between the second pair of opposing portions of the light-transmissive member 3. However, the light emitting device 200 may be configured to have two light-transmissive members 3A like the light emitting device 100A according to the second embodiment. Each of the four lateral portions of the light-transmissive member 3 has an inner lateral surface 31 that is formed so as to have an arc shape or a curved shape protruding toward the sealing member 4 when viewed in cross-section perpendicular to a lengthwise direction of the lateral portion. However, the inner lateral surface 31 may be formed so as to have a linear shape when viewed in cross-section perpendicular to a lengthwise direction of the lateral portion, like the light emitting devices 100B and 100C according to the third embodiment.

The sealing member 4 is formed so as to cover the inner lateral surfaces 31 of the four lateral portions of the light-transmissive member 3 and the upper surface and lateral surfaces of the light emitting element 2. Namely, the sealing member 4 is exposed at an upper surface of the light emitting device 200 according to the fourth embodiment. The light emitting device 200 has (vertical) lateral surfaces each including a lateral surface of the corresponding lateral portion of the light-transmissive member 3 and a lateral surface of the sealing member 4. In other words, each of the lateral surfaces of the light emitting device 200 has a lower lateral portion where the lateral surface of the corresponding lateral portion of the light-transmissive member 3 is exposed and has an upper lateral portion where the lateral surface of the sealing member 4 is exposed. The light emitting device 200 has a bottom surface that has: a peripheral portion at which a bottom surface of the light-transmissive member 3 is exposed; a middle portion at which a bottom surface of the light emitting element 2 is exposed, on which bottom surface the electrodes of the light emitting element 2 are provided; and an intermediate portion which is located between the outer peripheral portion and the middle portion and at which a bottom surface of the sealing member 4 is exposed. Namely, the bottom surfaces of the four lateral portions of the light-transmissive member 3, the bottom surface of the light emitting element 2, and the bottom surface of the sealing member 4 constitute the bottom surface of the light emitting device 100.

Other structures of the light emitting device 200 is the same as those of the light emitting device 100 according to the first embodiment, and thus overlapping description is omitted.

Light Emitting Device Manufacturing Method

Figure 11:
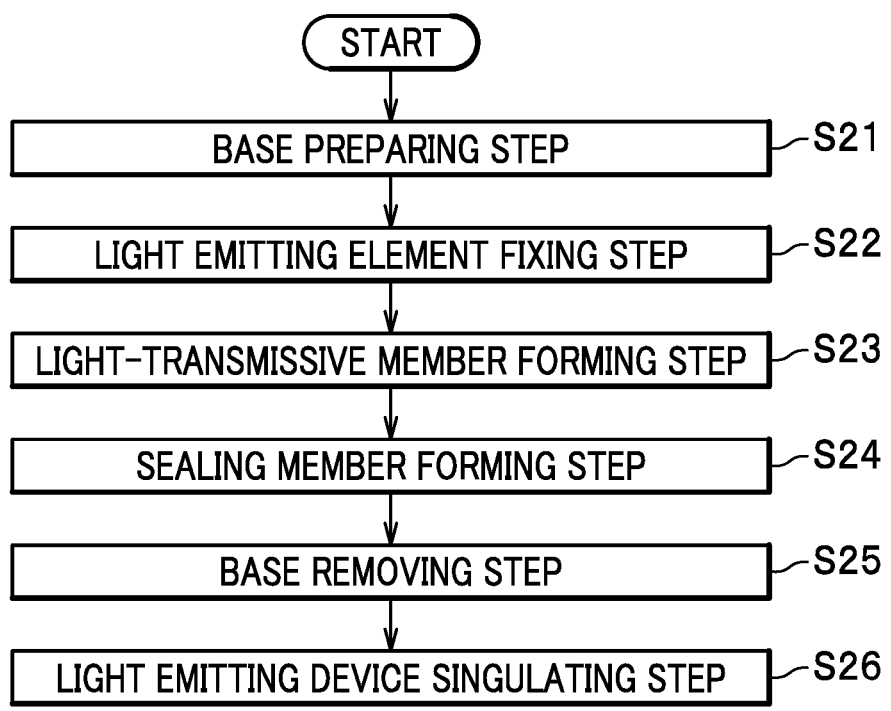
FIG. 11 is a flowchart showing a procedure of a method for manufacturing the light emitting device according to the fourth embodiment.
Figure 12A:
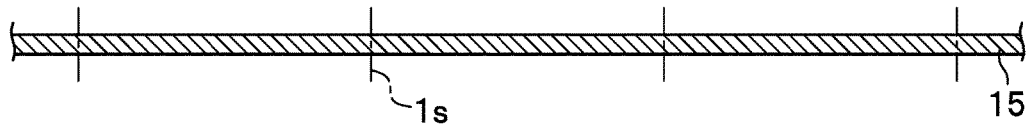
FIG. 12A is a schematic cross-sectional view showing an aspect of a base preparing step of the method for manufacturing the light emitting device according to the fourth embodiment.
Figure 12B:
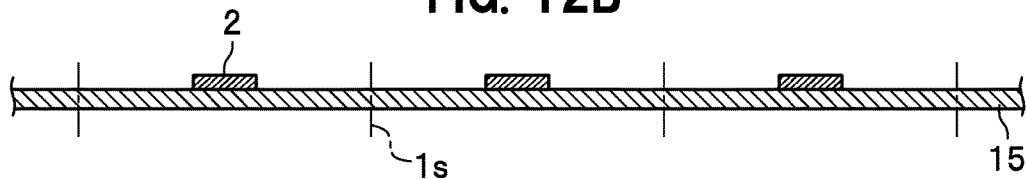
FIG. 12B is a schematic cross-sectional view showing an aspect of a light emitting element fixing step of the method for manufacturing the light emitting device according to the fourth embodiment.
Figure 12C:
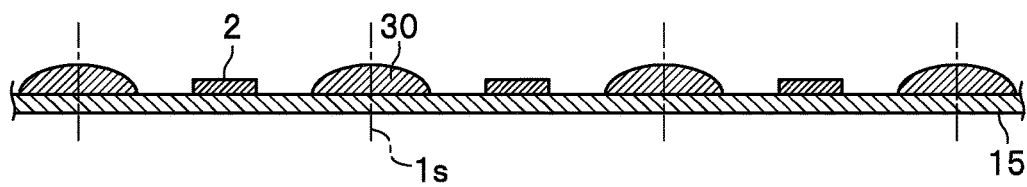
FIG. 12C is a schematic cross-sectional view showing an aspect of a light-transmissive member forming step of the method for manufacturing the light emitting device according to the fourth embodiment.
Figure 12D:
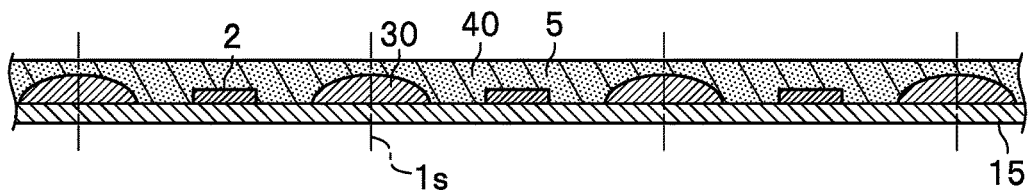
FIG. 12D is a schematic cross-sectional view showing an aspect of a sealing member forming step of the method for manufacturing the light emitting device according to the fourth embodiment.
Figure 12E:
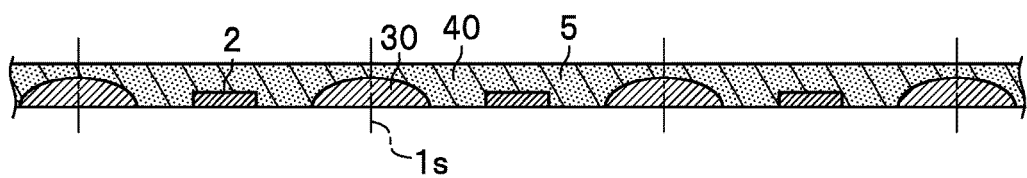
FIG. 12E is a schematic cross-sectional view showing an aspect of a base removing step of the method for manufacturing the light emitting device according to the fourth embodiment.
Figure 12F:
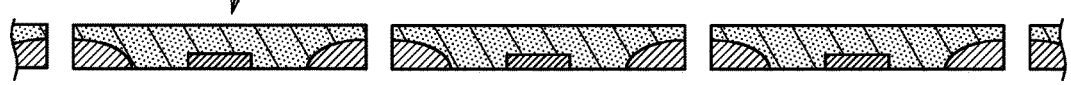
FIG. 12F is a schematic cross-sectional view showing an aspect of a light emitting device singulating step of the method for manufacturing the light emitting device according to the fourth embodiment.

Next, description will be given of a method for manufacturing a light emitting device 200 according to the fourth embodiment with reference to FIGS. 11 to 12F. FIG. 11 is a flowchart showing a procedure of the method for manufacturing the light emitting device 200 according to the fourth embodiment. FIG. 12A is a schematic cross-sectional view showing an aspect of a base preparing step of the method for manufacturing the light emitting device 200 according to the fourth embodiment. FIG. 12B is a schematic cross-sectional view showing an aspect of a light emitting element fixing step of the method for manufacturing the light emitting device 200 according to the fourth embodiment. FIG. 12C is a schematic cross-sectional view showing an aspect of a light-transmissive member forming step of the method for manufacturing the light emitting device 200 according to the fourth embodiment. FIG. 12D is a schematic cross-sectional view showing an aspect of a sealing member forming step of the method for manufacturing the light emitting device 200 according to the fourth embodiment. FIG. 12E is a schematic cross-sectional view showing an aspect of a base removing step of the method for manufacturing the light emitting device 200 according to the fourth embodiment. FIG. 12F is a schematic cross-sectional view showing an aspect of a light emitting device singulating step of the method for manufacturing the light emitting device 200 according to the fourth embodiment.

The method for manufacturing a light emitting device 200 according to the fourth embodiment includes the steps of a base preparing step S21, light emitting element fixing step S22, a light-transmissive member forming step S23, a sealing member forming step S24, a base removing step S25, and a light emitting device singulating step S26.

In the base preparing step S21, a base 15 on which light emitting elements 2 or the like have not been disposed is prepared. A flexible sheet member such as one made of a polyimide is used as the base 15 so that the base 15 may be easily removed by peeling-off in the later-described base removing step S25. The flexible sheet member has an upper surface on which an adhesive layer is formed to fix light emitting elements 2 in the later-described light emitting element fixing step S22.

In the light emitting element fixing step S22, light emitting elements 2 are picked up, placed, and fixed on the base 15 at predetermined locations using a collet or the like. The light emitting elements 2 are fixed on the base 15 by applying ultra-violet radiation on the adhesive layer of the base 15 to harden the adhesive layer.

In the light-transmissive member forming step S23, hardening composition is supplied onto the base 15 using a dispenser, then a light-transmissive member base body 30, from which light-transmissive members 3 are created later, is formed by hardening the hardening composition. The light-transmissive member base body 30 is disposed on the upper surface of the base 15 along boundaries is of light emitting devices 200 so that light emitting elements 2 thereof are each surrounded by the light-transmissive member base body 30 in a grid pattern. The dispenser is used to dispose the light-transmissive member base body 30 by linear coating the hardening composition on the upper surface of the base 15 in a grid pattern along the boundaries is of the light emitting devices 200.

In the sealing member forming step S24, hardening composition containing a phosphor 5 is supplied by a dispenser onto upper surfaces and lateral surfaces of the light emitting elements 2, an upper surface and lateral surfaces of the light-transmissive member base body 30, and an upper surface of the base 15. After that, the hardening composition is hardened to form a sealing member base body 40 from which sealing members 4 are created later.

In the base removing step S25, the base 15 is removed (peeled-off) from the structure composed of light emitting elements 2, the light-transmissive member base body 30, and the sealing member base body 40, and the base 15.

In the light emitting device singulating step S26, the light emitting devices 200, which have been formed in connection with each other, are singulated (diced). The singulation of the light emitting devices 200 is performed by cutting the structure along the boundaries is using a cutter or the like. In other words, the cutting is performed along paths on which the light-transmissive member base body 30 has been disposed to singulate the light emitting devices 200. The light emitting devices 200 are manufactured by carrying out the above-described steps.

The light emitting device 200 according to the fourth embodiment can have adjusted unevenness in chromaticity distribution by having the light-transmissive member 3 like the light emitting device 100 according to the first embodiment.

In each of the light emitting devices according to the above first, third, and forth embodiments, the light emitting device has been described as having a single light-transmissive member formed in a continuously-formed frame structure having four lateral portions, two of which constitute a first pair of opposing portions that extends in a predetermined direction and another two of which constitute a second pair of opposing portions that extends in a direction perpendicular to the predetermined direction, and a light emitting element is surrounded by the first and second pairs of opposing portions. In this case, the four lateral portions of the light-transmissive member are continuously formed in the frame structure. However, the four lateral portions of the light-transmissive member may not necessarily be continuously formed. For example, the light emitting device may have, in place of the single light-transmissive member, four separate light-transmissive members two of which constitute a first pair corresponding to the first pair of opposing portions and another two of which constitute a second pair corresponding to the second pair of opposing portions. The first and second pair of light-transmissive members are disposed such that ends of the first pair of light-transmissive members are respectively located adjacent to ends of the second pair of light-transmissive members to form a frame-like structure surrounding the light emitting element.

More generaly, the number of the light-transmissive members is not limited to those above-described as long as the light emitting element is interposed between a pair of opposing portions of light transmissive members or surrounded by two pairs of opposing portions of the light-transmissive members.

In each of the light emitting devices according to the above first to fourth embodiments, the sealing member has been described as being disposed so as to cover the inner lateral surfaces and the upper surface of each of the lateral portions of the light-transmissive member(s). However, the upper surface of the lateral portion may be partially covered by the sealing member. For example, the sealing member may be disposed such that only an inner portion of the upper surface located on the lateral thereof closer to the light emitting element is covered by the sealing member and an outer portion of the upper surface located on the outer lateral of the inner portion is exposed. In this case, when the phosphor in the sealing member is settled down in the sealing member forming step, since no phosphor is settled down onto the outer portion of the upper surface of the lateral portion, the amount of the phosphor present in lateral directions of the light emitting element is reduced and thus amount of yellow light emitted from the laterals of the light emitting device is reduced. This facilitates adjustment of unevenness in chromaticity distribution of light.

What is claimed is:

1. A light emitting device comprising:
    a base;
    a light emitting element disposed on the base;
    a single or plurality of light-transmissive members that have a pair of opposing portions spaced apart from each other and each having an inner lateral surface, an upper surface, and an outer lateral surface, the pair of opposing portions being disposed on the base such that the light emitting element is interposed between and spaced apart from the inner lateral surfaces of the pair of opposing portions; and
    a sealing member that contains a phosphor and covers the light emitting element, at least a portion of the upper surfaces of the pair of opposing portions, and the inner lateral surfaces thereof,
    wherein the light emitting device has a lateral surface having a lower region where the outer lateral surface of one of the pair of opposing portions is exposed and having an upper region where a lateral surface of the sealing member is exposed, and the outer lateral surface of the one of the pair of opposing portions and the lateral surface of the sealing member are flush with each other,
    wherein the sealing member has a thickness of at least 50 µm directly above the light emitting element, the thickness of the sealing member being defined as $t_4-t_2$, wherein $t_2$ is a thickness of the light emitting element and $t_4$ is a height of the upper surface of the sealing member from an upper surface of the base,
    wherein a ratio of, a distance $W_{23}$ between the inner lateral surface of one of the pair of opposing portions and a lateral surface of the light emitting element facing the inner lateral surface, and the thickness of the sealing member directly above the light emitting element $t_4-t_2$, is at least 0.8,
    wherein each of the pair of opposing portions has a width of at least 50 µm, and
    wherein each of the pair of opposing portions has a thickness $t_3$, the ratio of which to the width of each of the pair of opposing portions is at least 0.3 and at most 2.0.

2. A light emitting device according to claim 1, wherein each of the inner lateral surfaces of the pair of opposing portions of the single or plurality of light-transmissive members covered by the sealing member has an arc shape, a curved shape, or a linear shape when viewed in vertical cross-section.

3. A light emitting device according to claim 1, wherein the base has a conductive portion and an insulative portion,
    wherein the light emitting element has a lower surface facing the base and an upper surface opposite to the lower surface and has an electrode on the upper surface,
    wherein the light emitting device further has a wire electrically connecting between the conductive portion and the electrode.

4. A light emitting device according to claim 3, wherein the wire has a connecting portion connected to the conductive portion and covered by the sealing member.

5. A light emitting device according to claim 3, wherein the wire has a connecting portion connected to the conductive portion and covered by one of the pair of opposing portions of the single or plurality of light-transmissive members.

6. A light emitting device according to claim 1, the base is formed in a flat plate shape.

7. A light emitting device according to claim 1, wherein the phosphor is dispersed in the sealing member.

8. A light emitting device according to claim 1, wherein the single or plurality of light-transmissive members contain a light-diffusing material whose content is at least 1% by mass and at most 20% by mass.

9. A light emitting device according to claim 1, wherein each of the pair of opposing portions of the single or plurality of light-transmissive members has a width of at least 50 µm and a height of at least 50 µm when viewed in vertical cross-section, and transmits at least 50% of light emitted from the light emitting element,
    wherein the sealing member has a thickness of at least 50 µm above the pair of opposing portions of the single or plurality of light-transmissive members.

10. A light emitting device according to claim 1, wherein each of the pair of opposing portions of the single or plurality of light-transmissive members has a height-to-width ratio of at least 0.3 and at most 2.0.

11. A light emitting device according to claim 1, wherein the light emitting device has a first distance between each of the inner lateral surfaces of the pair of opposing portions of the single or plurality of light-transmissive members and a lateral surface of the light emitting element facing the inner lateral surface, and wherein a ratio of the first distance to a thickness of the sealing member directly above the light emitting element is at least 0.8 and at most 2.0.

12. A light emitting device according to claim 1, wherein the sealing member further covers an upper surface of the base and has a height therefrom a ratio of which to a height of the light emitting element is at least 1.2 and at most 6.0.

13. A light emitting device according to claim 1, wherein the light emitting device has two sets of the pair of opposing portions of the single or plurality of light-transmissive members disposed such that the light emitting element is surrounded by the two sets of the pair of opposing portions.

14. A light emitting device according to claim 1, wherein the single light-transmissive member has a continuous polygonal shape or a continuous circular shape in plan view.

15. A light emitting device according to claim 1,
wherein the plurality of light-transmissive members each has a line shape, a straight rod shape, or a rod shape having a bent or curbed portion.

16. A light emitting device according to claim 1,
wherein the single or plurality of light-transmissive members are made of a silicone resin.

17. A light emitting device according to claim 1,
wherein the single or plurality of light-transmissive members contain a light-diffusing material.

18. A light emitting device according to claim 1,
wherein the sealing member is made of a silicone resin.

19. A light emitting device according to claim 1,
wherein the light emitting device is of a substantially rectangular parallelepiped shape having a vertical dimension and horizontal dimensions, the vertical dimension being smaller than the horizontal dimensions.

20. A light emitting device comprising:
a light emitting element;
a single or plurality of light-transmissive members that have a pair of opposing portions spaced apart from each other and each having an inner lateral surface, an upper surface, and an outer lateral surface, the pair of opposing portions being arranged such that the light emitting element is interposed between and spaced apart from the inner lateral surfaces of the pair of opposing portions; and
a sealing member that contains a phosphor and covers the light emitting element, at least a portion of the upper surfaces of the pair of opposing portions, and the inner lateral surfaces thereof,
wherein the light emitting device has a lateral surface having a lower region where the outer lateral surface of one of the pair of opposing portions is exposed and having an upper region where a lateral surface of the sealing member is exposed, and the outer lateral surface of the one of the pair of opposing portions and the lateral surface of the sealing member are flush with each other,
wherein the sealing member has a thickness of at least 50 µm directly above the light emitting element, the thickness of the sealing member being defined as t4−t2, wherein t2 is a thickness of the light emitting element and t4 is a height of the upper surface of the sealing member from a bottom mounting surface of the light emitting element,
wherein a ratio of, a distance $W_{23}$ between the inner lateral surface of one of the pair of opposing portions and a lateral surface of the light emitting element facing the inner lateral surface, and the thickness of the sealing member directly above the light emitting element $t_4-t_2$, is at least 0.8,
wherein each of the pair of opposing portions has a width of at least 50 µm, and
wherein each of the pair of opposing portions has a thickness $t_3$, the ratio of which to the width of each of the pair of opposing portions is at least 0.3 and at most 2.0.

21. A light emitting device according to claim 20,
wherein the light emitting device has a bottom surface at which bottom surfaces of the pair of opposing portions of the single or plurality of light-transmissive members and a bottom surface of the sealing member are exposed.

22. A light emitting device according to claim 20,
wherein the light emitting device is of a substantially rectangular parallelepiped shape having a vertical dimension and horizontal dimensions, the vertical dimension being smaller than the horizontal dimensions.

* * * * *